(12) United States Patent
Mastain et al.

(10) Patent No.: US 9,842,740 B2
(45) Date of Patent: Dec. 12, 2017

(54) ABLATION FOR FEATURE RECOVERY

(71) Applicant: Seagate Technology LLC, Cupertino, CA (US)

(72) Inventors: Steven A. Mastain, Spring Park, MN (US); Terry A. Jacobson, Coon Rapids, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 259 days.

(21) Appl. No.: 14/835,326

(22) Filed: Aug. 25, 2015

(65) Prior Publication Data

US 2016/0059355 A1 Mar. 3, 2016

Related U.S. Application Data

(60) Provisional application No. 62/043,528, filed on Aug. 29, 2014.

(51) Int. Cl.
| | | |
|---|---|---|
| *B23K 26/362* | (2014.01) | |
| *B23K 26/00* | (2014.01) | |
| *B23K 26/06* | (2014.01) | |
| *B23K 26/03* | (2006.01) | |
| *H01L 21/268* | (2006.01) | |
| *H01L 21/302* | (2006.01) | |
| *H01L 21/20* | (2006.01) | |
| *B23K 26/0622* | (2014.01) | |
| *H01L 23/544* | (2006.01) | |
| *B23K 26/361* | (2014.01) | |
| *H01L 21/66* | (2006.01) | |
| *B23K 103/00* | (2006.01) | |

(52) U.S. Cl.
CPC ........ *H01L 21/302* (2013.01); *B23K 26/0006* (2013.01); *B23K 26/032* (2013.01); *B23K 26/0622* (2015.10); *B23K 26/361* (2015.10); *H01L 23/544* (2013.01); *B23K 2203/56* (2015.10); *H01L 22/20* (2013.01); *H01L 2223/5442* (2013.01); *H01L 2223/54426* (2013.01); *H01L 2223/54453* (2013.01); *H01L 2924/0002* (2013.01)

(58) Field of Classification Search
CPC ........ B23K 26/36; B23K 26/00; B23K 26/06; B23K 26/03; B23K 2203/56; H01L 21/26; H01L 21/30; H01L 22/20
USPC .......... 219/121.67–121.72, 121.82; 438/795
See application file for complete search history.

(56) References Cited

U.S. PATENT DOCUMENTS

| | | | |
|---|---|---|---|
| 5,104,480 A | 4/1992 | Wojnarowski et al. | |
| 5,191,187 A * | 3/1993 | Kajikawa | B23K 26/04 219/121.76 |
| 5,387,484 A | 2/1995 | Doany et al. | |

(Continued)

*Primary Examiner* — Samuel M Heinrich
(74) *Attorney, Agent, or Firm* — Holzer Patel Drennan

(57) ABSTRACT

When opaque films are deposited on semi-conductor wafers, underlying features may be concealed. In accordance with one implementation, such concealed features may be re-exposed via an ablation recovery process. One ablation recovery process entails aligning an energy source with a target position on a first surface of a semiconductor wafer based on position information retrieved from a second opposite surface of the semiconductor wafer, and firing a beam of the energy source to ablate opaque material at the target position and to expose a recovery feature underlying the opaque material.

19 Claims, 4 Drawing Sheets

(56) References Cited

U.S. PATENT DOCUMENTS

| | | | | |
|---|---|---|---|---|
| 5,597,590 | A | * | 1/1997 | Tanimoto .......... B23K 26/0823 219/121.61 |
| 5,602,079 | A | * | 2/1997 | Takenaka ........... H01L 39/2467 219/121.69 |
| 5,905,566 | A | | 5/1999 | Comulada et al. |
| 2005/0186753 | A1 | | 8/2005 | Chen et al. |
| 2012/0234807 | A1 | * | 9/2012 | Sercel ............... B23K 26/0608 219/121.69 |

* cited by examiner

ABLATION FOR FEATURE RECOVERY

CROSS-REFERENCE TO RELATED APPLICATIONS

The present application claims priority to pending U.S. Provisional Patent Application Ser. No. 62/043,528, entitled "Ablation for Feature Recovery," filed on Aug. 29, 2014, which is specifically incorporated by reference for all that it discloses and teaches.

BACKGROUND

Improvements in magnetic storage media technology allow for the areal recording densities on magnetic discs available today. However, as areal recording densities increase, transducer head designs also increase in complexity by incorporating increasing numbers of thin film layers and/or smaller, more detailed head features. These additional layers and detailed head features create challenges in ensuring proper alignments between various layers, features, and tools at a variety of stages in the manufacturing process.

SUMMARY

According to one implementation, a recovery process includes aligning an energy source with a target position on a first surface of a wafer based on position information retrieved from a second opposite surface of the wafer. The process further includes firing a beam of the energy source to ablate opaque material at the target position and to expose a recovery feature underlying the opaque material.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

BRIEF DESCRIPTIONS OF THE DRAWINGS

DETAILED DESCRIPTION

In some manufacturing processes, transducer heads for magnetic recording devices are formed in duplicate on a substrate (e.g., ceramic or silicon), also referred to as a wafer. Each transducer head includes a number of different features that operationally serve different functions. These features can be formed using a variety of techniques. For example, layers of material may be added to a wafer via deposition, spin-coating, or plating processes. Material can be removed from one or more layers via etching, milling, ashing, etc. A number of patterning processes allow for the controlled addition and removal of material in predetermined areas, including without limitation optical lithography, ebeam lithography, nanolithography, etc.

During manufacturing of transducer heads and other microelectronic devices, features may be formed and incidentally covered up by subsequently formed (e.g., deposited) layers of material. Therefore, semiconductor manufacturing processes may entail operations to subsequently "recover" (e.g., re-expose) certain concealed features by locally removing material overlying the feature(s) of interest. As used herein, "expose" means "to make visible" but does not necessarily imply direct exposure between a recovered feature and an environment external to the microelectronic device (e.g., a transducer head). In this sense, a feature can be "exposed" if it is encapsulated by and visible through one or more layers of transparent material. The term "recovery features" is used herein to refer to a variety of microelectronic device features that are subject to one or more recovery operations. Example recovery features include, without limitation, alignment marks, metrology features, inspection features, etc.

According to one implementation of the disclosed technology, a recovery feature is exposed on the surface of a wafer by removing material from the wafer using an ablation technique. The following implementations are discussed below primarily with reference to transducer heads for magnetic storage devices. However, transducer heads represent one of many types of microelectronic components and devices to which the disclosed technology is applicable. "Microelectronic" refers to, for example, small electronics made of semi-conductor materials that are typically measured on the micrometer-scale or smaller.

Figure 1:
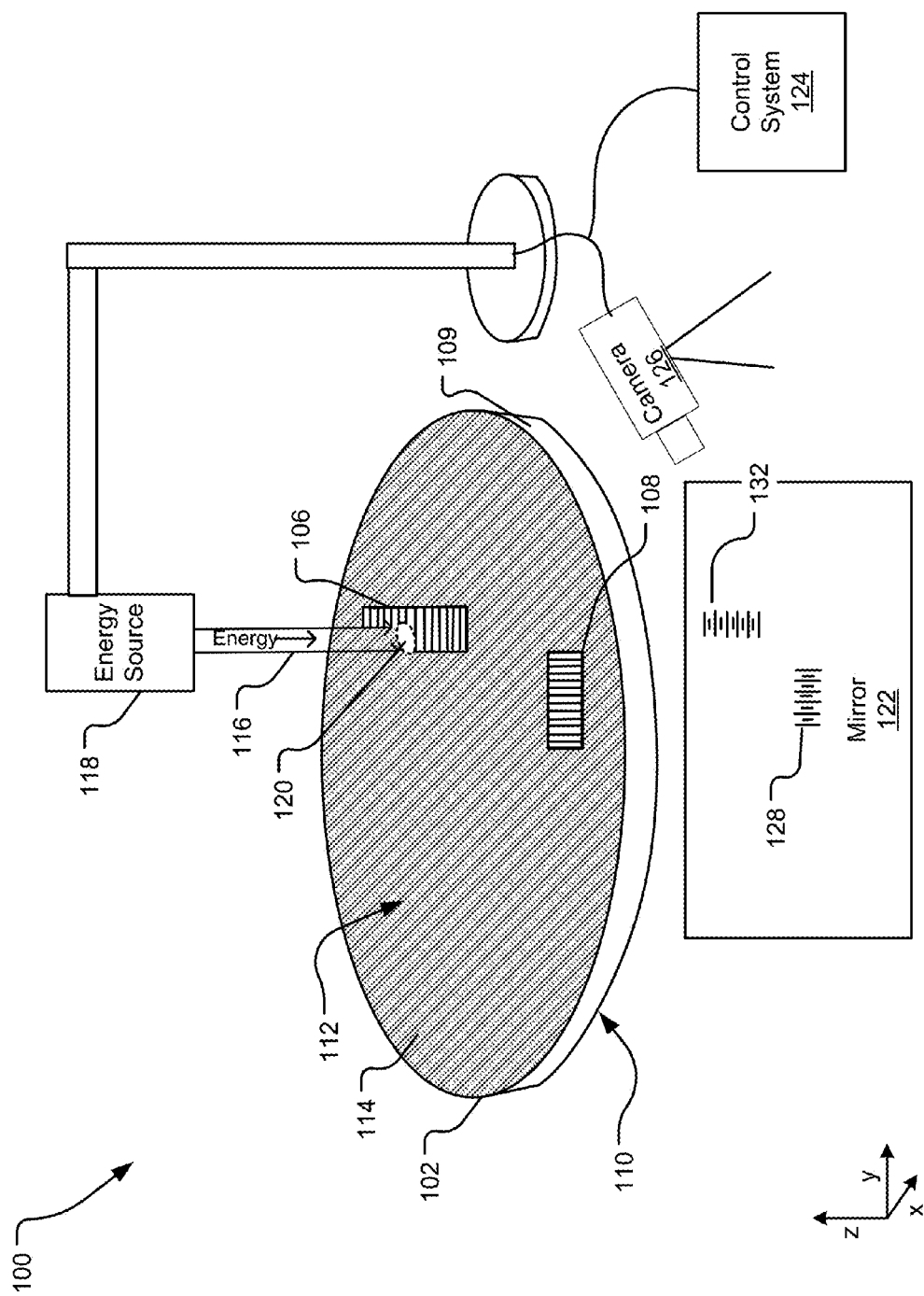
FIG. 1 illustrates an example system for exposing a recovery feature on a wafer using an ablation technique.

FIG. 1 illustrates an example system 100 for exposing a recovery feature on a wafer 102 using an ablation technique. The example wafer 102 includes two recovery features (e.g., recovery features 106 and 108) formed on a front surface 112 of a substrate 109.

Prior to commencement of an ablation recovery process, the recovery features 106 and 108 are concealed via deposition of one or more layers of opaque material (e.g., an opaque layer 114). To re-expose the recovery features 106 and 108 on the front surface 112, the opaque layer 114 is locally removed from the front surface 112 of the wafer 102 in regions overlying the recovery features 106 and 108.

In FIG. 1, the recovery feature 108 is shown after being fully re-exposed on the front surface 112 of the wafer 102 via an ablation recovery process utilizing an energy source 118. An energy source 118 is primarily contemplated herein as being a laser beam; however, the energy source 118 may, in other implementations, be another type of energy source capable of using a beam to remove material from a surface including without limitation an electron beam, ion plasma beam, etc. The recovery feature 106 is shown partially re-exposed, mid-way through an ablation recovery process. During each recovery process, a control system 124 repositions the energy source 118 a number of different times to achieve an alignment between an energy source footprint 120 and x-y coordinates of a recovery feature of interest.

In one implementation, the energy source 118 is a laser with a continuously pulsed beam 116 that ablates material to expose the recovery feature of interest. In other implementations, the beam 116 is continuous, and the intensity of the energy source 118 is high enough that surface material of the wafer 102 is ablated without pulsing.

The control system 124 determines a position of a concealed recovery feature based on an image of a back surface 110 of the wafer 102 captured by a camera 126. In particular, the back surface 110 of the wafer 102 includes a number of energy source alignment features (e.g., energy source alignment features 128, 132) that are used as reference points to identify positions of corresponding recovery features. In one implementation, each of the energy source alignment features is vertically aligned (e.g., along a z-direction axis) with a corresponding recovery feature.

In FIG. 1, the camera 126 captures an image of the energy source alignment features 128 and 132 reflected in a mirror 122. In other implementations, the mirror 122 may not be used. For example, the camera 126 may be positioned such that one or more of the energy source alignment features 128 and 132 are within a field of view of the camera 126.

The energy source alignment features 128 and 132 can be formed using a variety of different techniques. In one implementation, the energy source alignment features 128 and 132 are formed by etching material away from the back surface 110 using a chemical or mechanical etching (e.g., laser ablation) process.

In one implementation, the energy source alignment features 128 and 132 are formed after formation of the recovery features 106 and 108. The wafer 102 is patterned to include the recovery features 106 and 108 on the front surface 112 of the substrate 109, and the front surface 112 is coated with a protective dielectric material such as alumina or silicon dioxide. After depositing the protective dielectric coating, the wafer 102 is flipped so that the recovery features 106 and 108 face the mirror 122. The camera 126 captures a reflection of the recovery features 106 and 108 in the mirror 122, and the control system 124 determines x-y positions of each of the respective recovery features 106 and 108 using the captured image. The control system 124 then powers on the energy source 118 and etches the energy source alignment features 128 and 132 on the back surface 110 of the wafer 102, such that each of the energy source alignment features 128 and 132 corresponds to (e.g., is aligned with or systematically offset from) a corresponding one of the recovery features 106 and 108. After etching the energy source alignment features 128 and 132, the wafer 102 is then flipped over again, and patterning on the front surface 112 of the wafer 102 is resumed.

In another implementation, the energy source alignment features 128 and 132 are formed before the recovery features 106 and 108. Prior to patterning the front surface 112 of the wafer 102, the energy source alignment features 128 and 132 are etched on the back surface 110 of the wafer 102. The wafer 102 is subsequently flipped over so that the energy source alignment features 128 and 132 face downward toward the mirror 122 (as shown). The control system 124 then uses the mirror 122 and camera 126 to identify positions of the energy source alignment features 128 and 132 in the x-y plane. Subsequently, the recovery features 106 and 108 are formed at x-y positions that each respectively correspond to an x-y position of one of the energy source alignment features 128 and 132.

To align the energy source 118 for a recovery process, the control system 124 again uses the camera/mirror setup to identify a position of an energy source alignment feature corresponding to (e.g., aligned with) a recovery feature of interest. Using such position information, the control system 124 defines a target ablation region, and repositions the energy source 118 as appropriate to ablate material in the target ablation region.

During each recovery operation, the control system 124 positions and powers the energy source 118 based on a number of preset or dynamically selected energy source parameters. Energy source parameters include, for example, beam frequency, beam power, pulsing frequency, pulse duration, etc. Some energy source parameters may vary based on the type and/or thickness of the material ablated by the recovery process.

Figure 2:
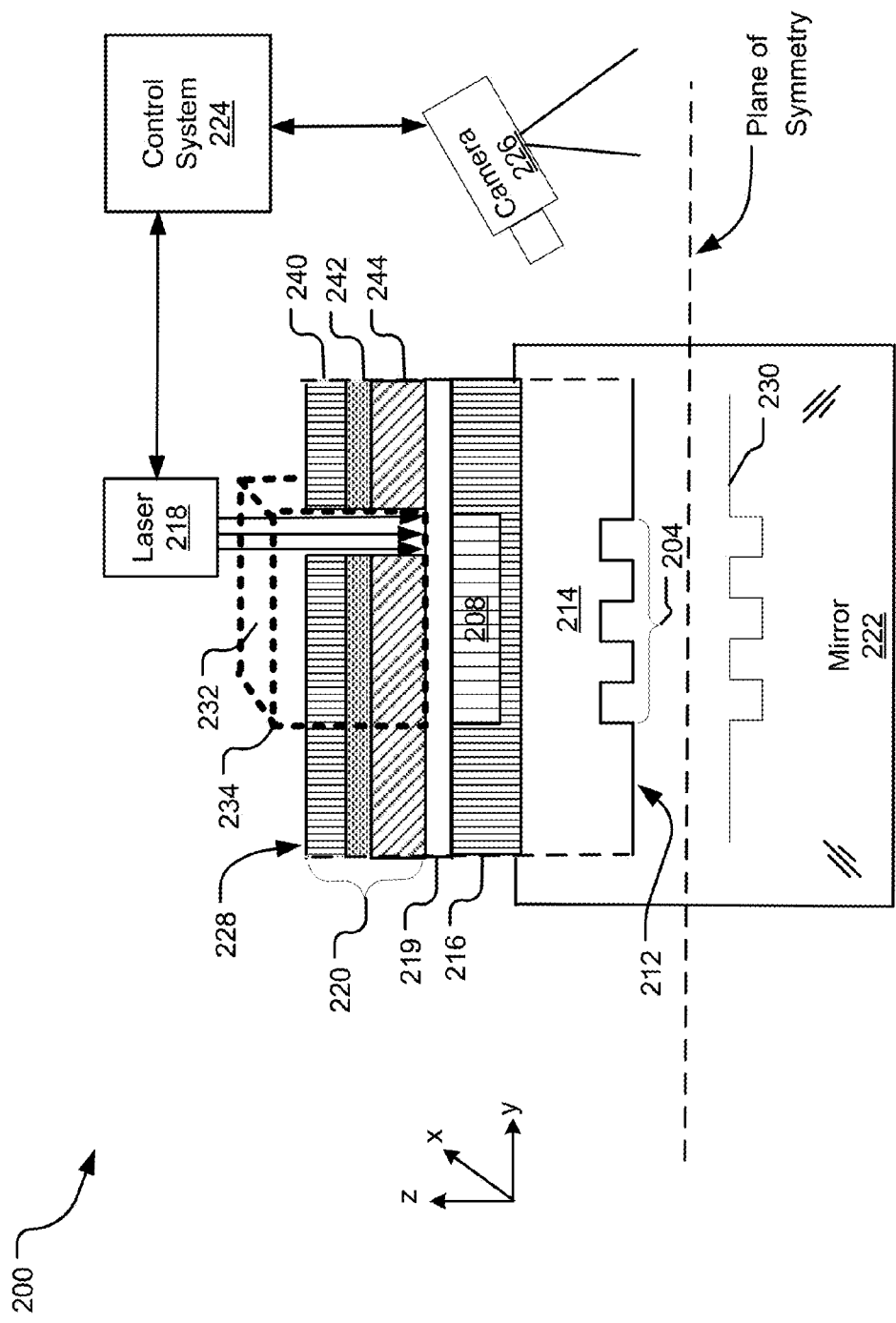
FIG. 2 illustrates a cross-sectional view of a portion of a wafer including an example recovery feature concealed by a stack of opaque layers.

FIG. 2 illustrates a cross-sectional view of a portion of a micro-electronic device 200 including an example recovery feature 208 positioned below a stack 220 of opaque thin film layers. The recovery feature 208 is formed in a basecoat layer 216 (e.g., alumina) deposited on top of a substrate 214. In some implementations, the recovery feature 208 is formed in the substrate 214 rather than in the basecoat layer 216. The recovery feature 208 is protected by a transparent layer 219 (e.g., alumina) that separates the recovery feature 208 from the stack 220. In one implementation, the stack 220 is a portion of a read sensor for a transducer head.

A back surface 212 of the micro-electronic device 200 includes an energy source alignment feature 204 (also referred to herein as a laser alignment feature) having a number of etched grooves. A reflection 230 of the energy source alignment feature 204 is shown in a mirror 222 underlying the micro-electronic device 200. In one implementation, the energy source alignment feature 204 occupies an x-y coordinate space identical to an x-y coordinate space occupied by the recovery feature 208.

Prior to commencement of an ablation recovery process, such as the illustrated laser ablation process, the recovery feature 208 is not visible from an upward facing surface 228 of the micro-electronic device 200. However, the mirror 222 is positioned to capture the reflection 230 within a field of view of a camera 226. A control system 224 is communicatively coupled to the camera 226 and also to a laser 218. The laser 218 is one example energy source; other implementations may utilize other suitable types of energy sources.

In one example recovery process, the control system 224 uses an image received from the camera 226 to identify an x-y coordinate space occupied by the energy source alignment feature 204. With such coordinates, the control system 224 defines x and y bounds (e.g., a 2-D window 232) of a target ablation region 234 to be cut into the upward facing surface 228 of the micro-electronic device 200. The control system 224 also determines a z-direction depth for the target ablation region 234 based on the thickness of the material to be removed. In one implementation, the z-direction depth of the target ablation region 234 is approximately equal to the z-direction thickness of the stack 220.

For each laser ablation recovery process, the control system 224 identifies values for a number of lasing parameters. The values of the lasing parameters may vary based on the material type(s) and depth(s) of material to be ablated by the laser 218. For example, the control system 224 may associate a hard layer with a first set of lasing parameter values and associate a soft layer with a second set of lasing parameter values. In this manner, each separate layer in the stack 220 can be associated with a unique pulsing frequency, pulse duration, etc. Values for lasing parameters are stored (e.g., in one or more tables) in a storage region accessible by the control system 224.

In one implementation, the control system 224 is embodied in a tangible computer-readable media. The term "tangible computer-readable storage media" includes, but is not limited to, RAM, ROM, EEPROM, flash memory or other memory technology, CDROM, digital versatile disks (DVD)

or other optical disk storage, magnetic cassettes, magnetic tape, magnetic disk storage or other magnetic storage devices, or any other tangible medium which can be used to store the desired information and which can be accessed by a computer. In contrast to tangible computer-readable storage media, intangible computer-readable communication signals may embody data resident in a modulated data signal, such as a carrier wave or other signal transport mechanism.

After defining the target ablation region 234, the control system 224 positions the laser 218 at a starting x-y coordinate position within the x-y coordinate space of the target ablation region 234.

The control system 224 fires the laser 218 to ablate material of the stack 220 and systematically removes the material in the target ablation region 234 based on the lasing parameters.

In one example laser ablation recovery process, the control system 224 continuously moves the laser 218 while pulsing the laser beam to ablate material from the target ablation region 234. For example, the laser 218 may perform a raster scan of the target ablation region, sweeping horizontally, left-to-right at a fixed rate of speed while pulsing at a steady rate. Upon reaching the right boundary of the target ablation region 234, the control system 224 pauses the pulsing, moves the laser 218 rapidly back to the left boundary of the target ablation region 234, and alters the vertical position of the laser 218. At the altered vertical position, the control system 224 resumes pulsing of the beam of the laser 218 while again moving the laser 218 left-to-right, ablating material along a row adjacent to a row affected by the prior pass. On each subsequent "pass" (e.g., left-to-right movement) of the laser 218, the laser beam may slightly overlap a path cut on the previous pass. The amount of this overlap can vary depending on the thickness and material type of the material to be removed.

In another implementation, the laser 218 remains in a stationary position while pulsing or firing a continuous light beam to form a cavity of predetermined depth within the target ablation region 234. If, for example, the stack 220 has a z-direction thickness of 50 angstroms, the laser 218 may fire in a fixed position until about 50 angstroms of material is removed. Once the resulting cavity is of a predetermined depth (e.g., z-direction depth), the control system 224 repositions the laser 218 to ablate away material at a different x-y coordinate location within the target ablation region 234. At the new position of the laser 218, the laser ablation is resumed.

In another implementation, the laser 218 is moved away from and repeatedly returned to a same position multiple times. For example, the laser 218 may be pulsed at an initial position (e.g., an x-y coordinate position), moved away from that position (e.g., pulsed at other positions), and subsequently returned to that initial position one or more times for additional pulsing to further deepen a resulting cavity. In this sense, a shallow, large cavity may be formed in an area overlying the recovery feature 208 and gradually deepened by repeated passes of the pulsing laser beam.

In at least one implementation, the individual layers of material within the target ablation region 234 are removed one at a time. For example, the laser 218 may remove all material from an upper layer 240 before beginning to remove any material from a middle layer 242. The middle layer 242 of material may be fully removed within the target ablation region 234 before removing material from a bottom layer 244.

In one implementation, the above-described alignment and material ablation techniques yield a precision alignment between x and y bounds of the target ablation region 234 and the recovery feature 208 on the order of tens of nanometers.

A variety of lasers may be suitable for implementation in the micro-electronic device 200. In one example implementation, the laser 218 is a 355 nm diode-pumped laser capable of producing a 500 mW beam. To ablate material of the target ablation region 234, the laser is pulsed with a frequency in a range between about 10 kHz and 100 kHz. The beam is up-scoped out of the laser 218 using a 10× beam expander and passed through an aperture to eliminate beam fringes. Beam focusing is achieved using a 0.5 inch F-theta scanning lens with a spot size of approximately 6 microns (μm). In one implementation, the laser 218 is an excimer laser.

After finishing the laser ablation recovery process (e.g., by removing all material within the target ablation region 234), the recovery feature 208 is again visible to a viewer examining the upward facing surface 228 of the micro-electronic device 200. In one implementation, the recovery feature 208 is subsequently used to align the micro-electronic device 200 and a template mask (not shown) for a lithography patterning process. For example, a template mask can be used to form a patterned photo resist (not shown) on the micro-electronic device 200 that protects certain portions of the micro-electronic device 200 during one or more subsequent deposition processes.

In various implementations, the target ablation region 234 may assume a variety of shapes and sizes. The z-direction depth of a cavity formed via laser ablation recovery process may range from a few angstroms to a few thousand angstroms. For example, the (z-direction) depth of the target ablation region 234 may range from about 40 Angstroms to 1800 or more Angstroms. The x-y area of exposed recovery features may range from less than 1000 square microns ($\mu m^2$) up to millions of square microns.

Figure 3:
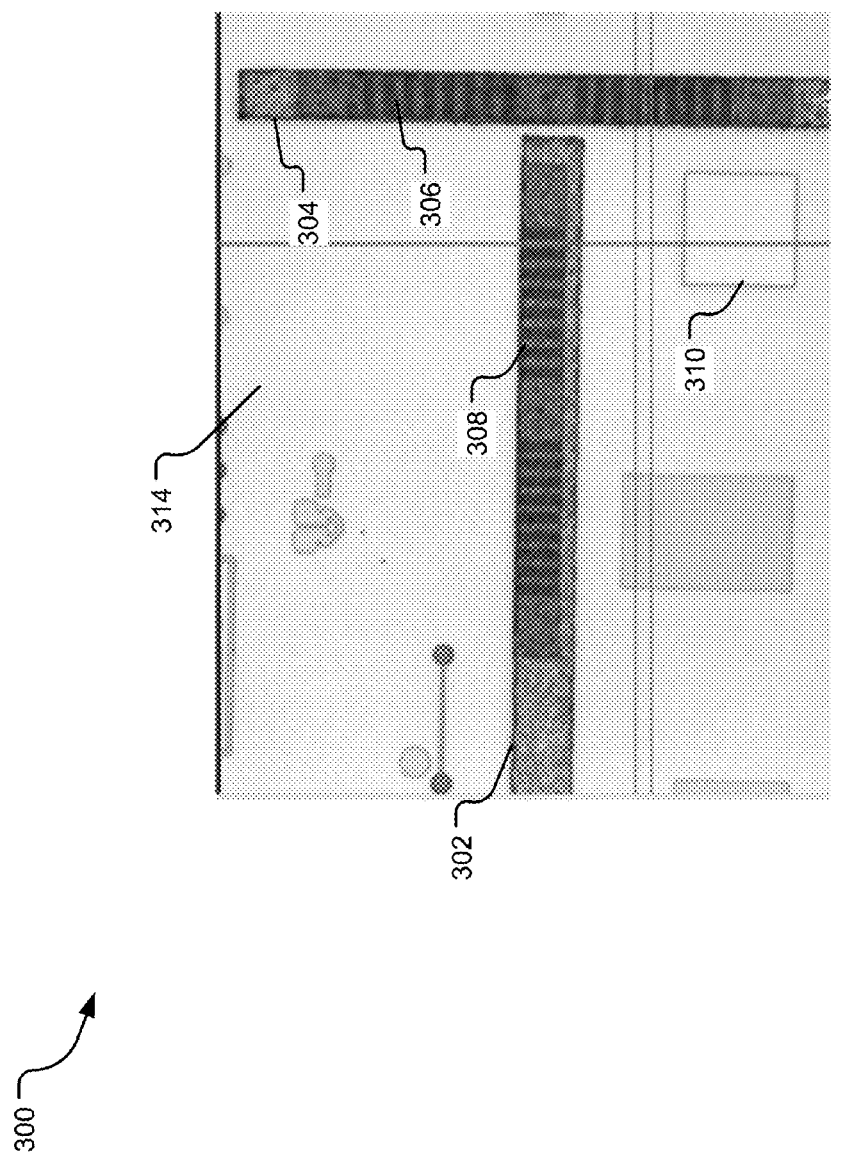
FIG. 3 illustrates a top view of a microelectronic device including example recovery features that can be exposed via a laser ablation recovery process.

FIG. 3 illustrates a top view of an example transducer head 300 with exposed recovery features (e.g., recovery features 306 and 308) and a metrology feature 310. Windows 302 and 304 are formed via a laser ablation recovery process to expose underlying recovery features 306 and 308. Energy source alignment features (not shown) are aligned with each of the recovery features 306 and 308 on an opposite side of the transducer head 300. In FIG. 3, the metrology feature 310 is shown visible through a transparent layer of material 314. However, in some implementations, the metrology feature 310 is exposed (made visible) by ablating away overlying opaque material.

Figure 4:
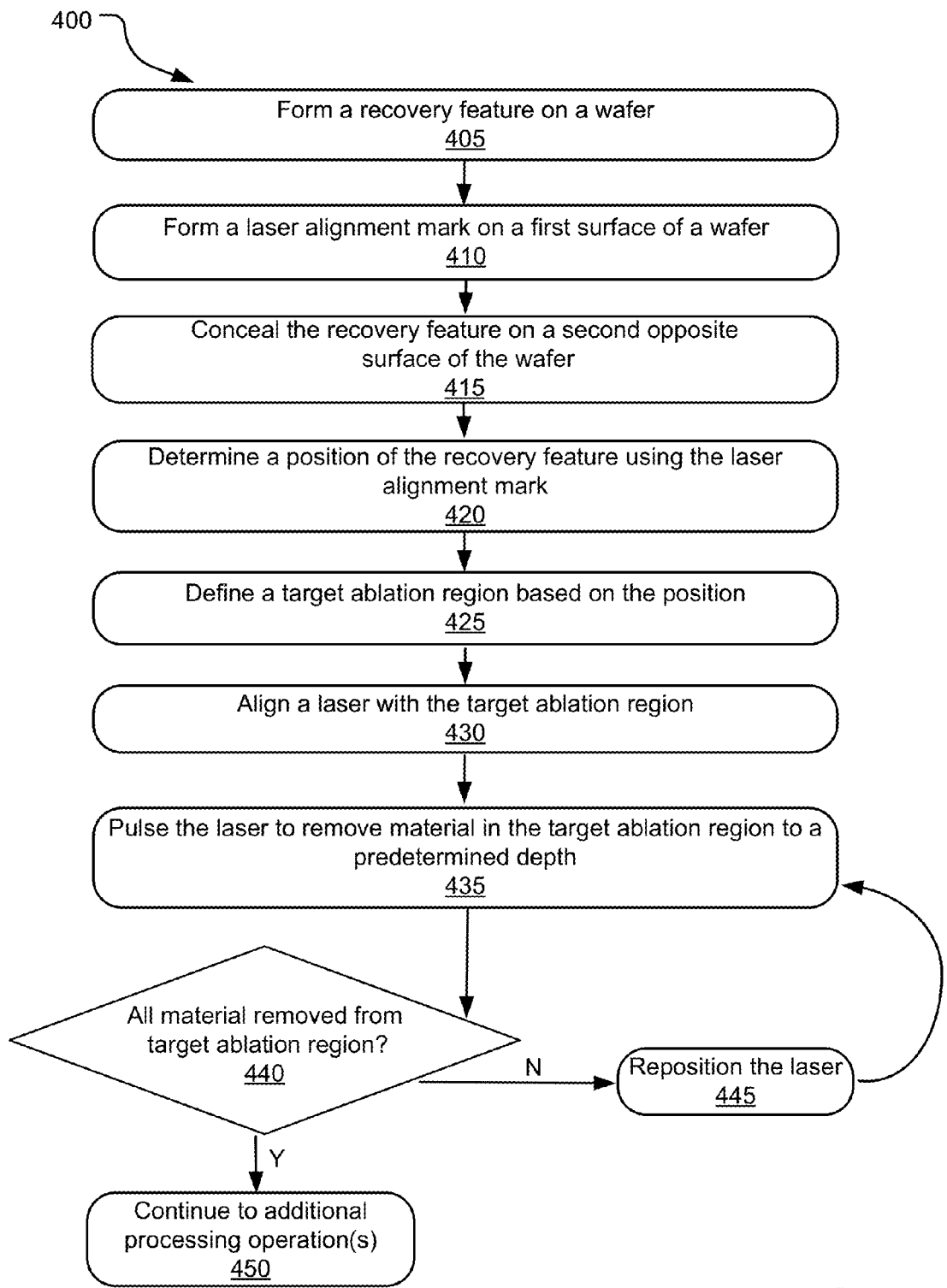
FIG. 4 illustrates example operations for a laser ablation recovery process.

FIG. 4 illustrates example operations 400 for a laser ablation recovery process. A formation operation 405 forms a recovery feature on a front surface of a wafer. In one implementation, the recovery feature is coated with a protective dielectric material and the wafer is flipped over (rotated by 180 degrees) prior to a formation operation 410.

On an opposite surface (e.g., a back surface) of the wafer, the formation operation 410 forms an energy source alignment feature. In one example implementation, the energy source alignment feature is formed while the wafer is positioned such that the recovery feature on the opposite surface faces toward a mirror. A camera captures a reflection of a set of recovery features in the mirror, and the reflection is used to identify an x-y coordinate space (i.e., a range of coordinates) occupied by the recovery feature. The formation operation 410 then forms the energy source alignment feature in an x-y coordinate space corresponding to an x-y coordinate spaced occupied by the recovery feature. In one implementation, the energy source alignment feature occupies the same x-y coordinate space as the recovery feature.

In another implementation, the recovery feature is offset from the energy source alignment feature in the x-y plane, and an x-y offset between the two features is saved for reference.

In another implementation, the order of operations 405 and 410 is reversed. Prior to forming the recovery feature on the front surface of the wafer, the energy source alignment feature is formed on the back surface of the wafer. The wafer is subsequently flipped over to face a mirror so that a reflection of the energy source alignment feature is captured by a camera. From this reflection, an x-y coordinate space of the energy source alignment feature is identified, and the recovery feature is subsequently formed in an x-y coordinate space corresponding to the x-y coordinate space occupied by the energy source alignment feature. If the recovery feature is offset from the energy source alignment feature in the x-y plane, offsets between the two features are saved for reference.

A concealing operation 415 conceals the recovery feature on the front surface of the wafer, such as by depositing one or more layers of opaque material in an area overlaying the recovery feature.

A determination operation 420 determines a position (e.g., an occupied x-y coordinate space) of the recovery feature using an image of the energy source alignment feature received from a camera. In one implementation, the camera captures a mirror reflection of the energy source alignment feature on the back surface of the wafer, and a control system uses the image to identify the position of the energy source alignment feature. In one implementation, saved x/y offset values are added to identified x/y coordinates of the energy source alignment feature to derive the x-y coordinate space occupied by the recovery feature. In another implementation, the energy source alignment feature and the recovery feature occupy the same x-y coordinate space. For example, the energy source alignment feature and the recovery feature may be identical, with identical areas and x-y coordinate boundaries.

Based on the position of the recovery feature and/or saved information regarding characteristics of the opaque layer(s) concealing the recovery feature, a defining operation 425 defines a target ablation region where material is to be removed via a laser ablation recovery process. An alignment operation 430 aligns the laser so that a light beam emitted by the laser may strike the wafer within the target ablation region.

A pulsing operation 435 pulses the laser to remove material down to a predetermined depth. A determination operation 440 determines whether all material has been removed from within the target ablation region. If material remains to be removed from the target ablation region, a repositioning operation 445 repositions the laser and the pulsing operation 435 resumes pulsing of the laser at the new position to a predetermined depth. The determination operation 440, repositioning operation 445, and pulsing operation 435 repeat sequentially until the determining operation 440 determines that all material has been removed from the target ablation region.

If the determination operation 440 determines that all material has been removed from within the bounds of the target ablation region, the laser ablation recovery process terminates and additional processing operations 450 commence. For example, the additional processing operations 450 may include an alignment operation wherein the recovery feature is used to align the wafer with a template mask for a lithography patterning process. In another implementation, the additional processing operation 450 is a measurement operation performed using a metrology feature exposed by the laser ablation recovery operation.

The specific steps discussed with respect to each of the implementations disclosed herein are a matter of choice and may depend on the materials utilized and/or the topography-related requirements of a given system. The steps discussed may be performed in any order, adding and omitting as desired, unless explicitly claimed otherwise of a specific order is inherently necessitated by the claim language.

The above specification, examples, and data provide a complete description of the structure and use of exemplary implementations of the invention. Since many implementations of the invention can be made without departing from the spirit and scope of the invention, the invention resides in the claims hereinafter appended.

What is claimed is:

1. A method comprising:
   determining an offset between an alignment feature visible on a first surface of a semiconductor wafer and a recovery feature embedded below a second opposite surface of the semiconductor wafer, the recovery feature separated from the second opposite surface by at least one layer of opaque material;
   aligning an energy source with a target position on the second opposite surface of the semiconductor wafer based on the determined offset between the recovery feature and the alignment feature; and
   firing a beam of the energy source to ablate opaque material at the target position and to expose the recovery feature underlying the opaque material.

2. The method of claim 1, wherein the energy source is a laser.

3. The method of claim 1, wherein aligning the energy source further comprises:
   aligning the energy source with the target position using the alignment feature visible on the first surface.

4. The method of claim 3, further comprising:
   etching the alignment feature on the first surface of the semiconductor wafer; and
   rotating the semiconductor by 180 degrees prior to the alignment operation.

5. The method of claim 3, further comprising:
   positioning a mirror to reflect an image of the second surface including the alignment feature.

6. The method of claim 3, further comprising:
   capturing, with a camera, a reflection of the alignment feature in a mirror; and
   identifying a position of the recovery feature based on the reflection.

7. The method of claim 6, further comprising:
   defining a target ablation region based on the identified position of the recovery feature.

8. The method of claim 7, wherein the target position is within the target ablation region.

9. The method of claim 1, wherein firing the beam further comprises:
   pulsing the beam to remove material down to a predetermined depth.

10. The method of claim 7, wherein the energy source performs a raster scan to ablate material in the target ablation region.

11. A system comprising:
    a camera positioned to capture an image of a first surface of a semiconductor wafer including an alignment feature;
    a control system communicatively coupled to the camera, the control system configured to use feedback from the camera and a saved offset between the alignment feature and a recovery feature to identify a position on a second opposite surface of the semiconductor wafer aligned with the recovery feature, the second opposite surface separated from the recovery feature by a layer of opaque material; and a laser communicatively coupled to the control system, wherein the control system is further configured to control the laser to ablate the layer of opaque material at the identified position on the second opposite surface to expose the recovery feature.

12. The system of claim 11, wherein the image of the first surface captured by the camera is a reflection of the first surface.

13. The system of claim 11, wherein the alignment feature is etched into the first surface.

14. The system of claim 11, wherein the control system is further configured to define bounds of a target ablation region based on the identified position of the recovery feature.

15. The system of claim 11, wherein the laser is a pulsed-diode laser.

16. A method comprising:

generating an image of an alignment feature on a first surface of a semiconductor wafer;

identifying a target position on a second opposite surface of the semiconductor wafer based on the image, the target position aligned with a recovery feature embedded within the semiconductor wafer and separated from the second opposite surface by a layer of opaque material;

firing a laser to ablate opaque material from a second opposite surface of the semiconductor wafer to expose the recovery feature on the second opposite surface, the recovery feature vertically aligned with the alignment feature.

17. The method of claim 16, wherein the image is captured by a camera.

18. The method of claim 17, wherein the image is a mirror reflection of the first surface captured by the camera.

19. The method of claim 16, further comprising:

etching the recovery feature into the second opposite surface.

* * * * *